(12) United States Patent
Wolters et al.

(10) Patent No.: US 9,678,350 B2
(45) Date of Patent: Jun. 13, 2017

(54) LASER WITH INTEGRATED MULTI LINE OR SCANNING BEAM CAPABILITY

(71) Applicant: KLA-Tencor Corporation, Milpitas, CA (US)

(72) Inventors: Christian Wolters, San Jose, CA (US); Jijen Vazhaeparambil, Saratoga, CA (US); Dirk Woll, San Jose, CA (US); Anatoly Romanovsky, Palo Alto, CA (US); Bret Whiteside, Gilroy, CA (US); Stephen Biellak, Sunnyvale, CA (US); Guoheng Zhao, Palo Alto, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 127 days.

(21) Appl. No.: 13/845,587

(22) Filed: Mar. 18, 2013

(65) Prior Publication Data
US 2013/0250385 A1 Sep. 26, 2013

Related U.S. Application Data

(60) Provisional application No. 61/613,157, filed on Mar. 20, 2012, provisional application No. 61/791,106, filed on Mar. 15, 2013.

(51) Int. Cl.
*G02B 26/08* (2006.01)
*G02B 26/10* (2006.01)
(Continued)

(52) U.S. Cl.
CPC ......... *G02B 27/1006* (2013.01); *G02B 26/10* (2013.01); *G02B 26/106* (2013.01);
(Continued)

(58) Field of Classification Search
CPC ....... G02B 5/0891; G02B 21/16; H01S 3/005; H01S 3/0092; H01S 3/2383;
(Continued)

(56) References Cited

U.S. PATENT DOCUMENTS 5,742,626 A * 4/1998 Mead et al. ..................... 372/22
5,760,900 A * 6/1998 Ito et al. ........................ 356/338
(Continued)

FOREIGN PATENT DOCUMENTS

| GB | 2429843 A | 6/2005 |
|----|-----------|--------|
| TW | 367407 | 8/1999 |

(Continued)

OTHER PUBLICATIONS

Title: Method for Splitting a Pattern for Use in a Multi-Beam Lithography Apparatus Source: http://ip.com/IPCOM/000207279 Date of disclosure: May 24, 2011.

*Primary Examiner* — Bumsuk Won
*Assistant Examiner* — Collin X Beatty
(74) *Attorney, Agent, or Firm* — Suiter Swantz pc llo

(57) ABSTRACT

A method and system for providing illumination is disclosed. The method may include providing a laser having a predetermined wavelength; performing at least one of: beam splitting or beam scanning prior to a frequency conversion; converting a frequency of each output beam of the at least one of: beam splitting or beam scanning; and providing the frequency converted output beam for illumination.

20 Claims, 3 Drawing Sheets

(51) Int. Cl.
*G02B 26/12* (2006.01)
*G02B 27/10* (2006.01)
*G02F 1/01* (2006.01)
*G03F 7/20* (2006.01)
*G02F 1/35* (2006.01)
*H01S 3/00* (2006.01)

(52) U.S. Cl.
CPC .......... *G02F 1/0105* (2013.01); *G03F 7/7065* (2013.01); *G02F 1/353* (2013.01); *H01S 3/0071* (2013.01); *H01S 3/0092* (2013.01)

(58) Field of Classification Search
CPC .. H01S 3/06758; H01S 3/0057; H01S 3/1106; H01S 3/109; H01S 5/0092; H01S 5/4012; G02F 1/29; G02F 1/353; G02F 1/3534; G02F 1/3544; G02F 1/37; G02F 1/39; G02F 2001/3546
USPC .... 372/6, 22, 55, 21, 25; 359/285–287, 340, 359/349, 326, 328, 201.1, 201.2
See application file for complete search history.

(56) References Cited

U.S. PATENT DOCUMENTS

| | | | |
|---|---|---|---|
| 5,936,755 A | 8/1999 | Inagaki | |
| 6,078,600 A | 6/2000 | Gruen | |
| 6,084,716 A | 7/2000 | Sanada et al. | |
| 6,373,869 B1* | 4/2002 | Jacob | 372/22 |
| 6,477,188 B1* | 11/2002 | Takaoka et al. | 372/22 |
| 6,618,070 B2 | 9/2003 | Fischer et al. | |
| 6,731,384 B2 | 5/2004 | Ohshima et al. | |
| 6,890,474 B2* | 5/2005 | Gruber | G02F 1/3525 219/121.75 |
| 7,471,705 B2* | 12/2008 | Gerstenberger et al. | 372/21 |
| 7,627,007 B1* | 12/2009 | Armstrong et al. | 372/21 |
| 7,852,549 B2* | 12/2010 | Alekel et al. | 359/328 |
| 8,144,740 B1* | 3/2012 | Brown et al. | 372/32 |
| 8,294,887 B1* | 10/2012 | Biellak et al. | 356/237.1 |
| 2002/0085085 A1* | 7/2002 | Fischer et al. | 347/239 |
| 2003/0231663 A1 | 12/2003 | Ohtsuki et al. | |
| 2004/0114211 A1* | 6/2004 | Trepagnier | G01J 3/08 359/328 |
| 2005/0270650 A1 | 12/2005 | Tsukihara et al. | |
| 2006/0291862 A1* | 12/2006 | Kawai | 398/79 |
| 2007/0064749 A1* | 3/2007 | Kaneda et al. | 372/21 |
| 2007/0064750 A1* | 3/2007 | Kaneda et al. | 372/21 |
| 2007/0098028 A1* | 5/2007 | Alcock et al. | 372/29.015 |
| 2007/0248136 A1* | 10/2007 | Leonardo et al. | 372/55 |
| 2008/0296272 A1* | 12/2008 | Lei et al. | 219/121.69 |
| 2009/0084989 A1* | 4/2009 | Imai | 250/492.22 |
| 2009/0116009 A1* | 5/2009 | Nelson et al. | 356/326 |
| 2011/0267671 A1* | 11/2011 | Peng et al. | 359/257 |
| 2012/0026578 A1* | 2/2012 | Sakuma | 359/328 |
| 2012/0212791 A1* | 8/2012 | Okada | 359/202.1 |
| 2012/0242995 A1* | 9/2012 | Konno et al. | 356/450 |
| 2014/0050235 A1* | 2/2014 | Clowes et al. | 372/6 |
| 2014/0118730 A1* | 5/2014 | Kavaldjiev et al. | 356/237.5 |
| 2014/0133011 A1* | 5/2014 | Schwedt et al. | 359/298 |

FOREIGN PATENT DOCUMENTS

| | | |
|---|---|---|
| TW | 200737625 A | 10/2007 |
| WO | 2011146310 A1 | 11/2011 |
| WO | WO 2013007591 A1 * | 1/2013 |

* cited by examiner

LASER WITH INTEGRATED MULTI LINE OR SCANNING BEAM CAPABILITY

CROSS-REFERENCE TO RELATED APPLICATIONS

The present application claims the benefit under 35 U.S.C. §119(e) of U.S. Provisional Application Ser. No. 61/613,157, filed Mar. 20, 2012. Said U.S. Provisional Application Ser. No. 61/613,157 is hereby incorporated by reference in its entirety.

The present application also claims the benefit under 35 U.S.C. §119(e) of U.S. Provisional Application Ser. No. 61/791,106, filed Mar. 15, 2013. Said U.S. Provisional Application Ser. No. 61/791,106 is hereby incorporated by reference in its entirety

TECHNICAL FIELD

The disclosure generally relates to the field of inspection systems, and particularly to a laser source for inspection systems.

BACKGROUND

Thin polished plates such as silicon wafers and the like are a very important part of modern technology. A wafer, for instance, may refer to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well. The term wafer and the term thin polished plate may be used interchangeably in the present disclosure.

Semiconductor materials may be inspected for defects such as, e.g., surface imperfections, particles, irregularities the thickness of thin film coatings, and the like, which may hamper the performance of the semiconductor material. Some existing inspection systems direct a beam of radiation on the surface of the semiconductor material, then collect and analyze light reflected and/or scattered from the surface to quantify characteristics of the surface.

More specifically, existing systems generally utilize a beam scanner created by having a laser source with fixed output and adding an external scanning mechanism, such as an Acousto-Optic Device (AOD) scanner or a resonant scanner. Typical frequency converting laser sources use fixed spot design, where the source spot is focused on an oversized crystal, which is shifted to a fresh area when the exposed area has degraded to an undesirable level.

While the existing design works for lower power visible applications, high power ultraviolet (UV) and deep UV (DUV) applications create technical challenges related to the damage potential of scanning optics, which result in a life time and reliability issue of the light source itself. For instance, in case of an AOD, the limited optical efficiency of an AOD scanner (for example 50% for a dual AOD scanner at 266 nm) requires a very high power UV light source to make up for the efficiency loss. Currently, for example a few hundred mW laser power on the wafer is needed to fulfill the sensitivity requirement of scanning system, which means it requires more than 1 W laser source. Such a source has been considered technically extremely challenging until the very recent past and technical feasibility and life time is still in question. Future tool generations require even higher power levels, and the availability of such a laser is considered today a very high risk.

Therein lies a need for providing a laser source for inspection systems without the aforementioned shortcomings.

SUMMARY

The present disclosure is directed to an illumination apparatus. The illumination apparatus includes a laser source configured for providing a laser having a predetermined wavelength, a beam splitter configured for directly receiving the laser from the laser source and splitting the laser into a plurality of parallel beams, and a frequency converter configured for receiving the plurality of parallel beams and converting the frequency of each of the plurality of parallel beams.

An additional embodiment of the present disclosure is also directed to an illumination apparatus. The illumination apparatus includes a laser source configured for providing a laser having a predetermined wavelength, a frequency converter, and a scanner. The scanner is positioned in an optical path between the laser source and the frequency converter, wherein the scanner is configured for providing beam scanning prior to frequency conversion.

A further embodiment of the present disclosure is directed to a method for providing illumination. The method may include providing a laser having a predetermined wavelength; performing at least one of: beam splitting or beam scanning prior to a frequency conversion; converting a frequency of each output beam of the at least one of: beam splitting or beam scanning; and providing the frequency converted output beam for illumination.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

The present disclosure is directed to an illumination system for scanning single and multi-line beam inspection systems, such as AOD scanners used in wafer inspection. More specifically, in accordance with one embodiment of the present disclosure, a method to enhance the life of a frequency converting crystal in a laser system is disclosed. Instead of having a scanner and/or multi-line generating optic external to the laser, it is integrated into the laser in accordance with one embodiment of the present disclosure. Such an integrated laser has specific advantage for frequency converting lasers, for example UV or DUV lasers in terms of cost effectiveness through enhanced laser and optics life.

Figure 1:
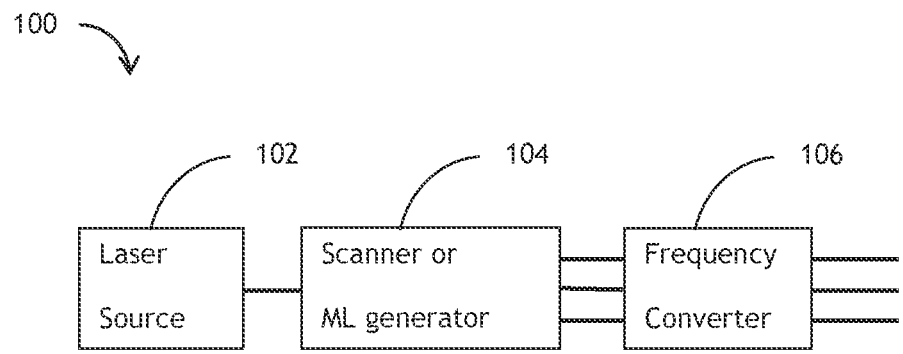
FIG. 1 is a block diagram depicting the front end illumination of a wafer inspection system.

Referring to FIG. 1, a block diagram depicting an exemplary illumination system 100 is shown. The illumination system 100 includes a laser source 102 configured for delivering a laser to a scanner or multi-line generator 104. The laser delivered by the laser source 102 may have a predetermined wavelength to satisfy a specific illumination requirement.

In accordance with one embodiment of the present disclosure, the laser beam is split into a plurality of parallel lines or provided as a single scanning line before hitting the frequency converter 106. It is contemplated that various beam splitting techniques may be utilized, including, but not limited to, diffractive optical elements (or DOEs), fibers, beam splitters and the like. In addition, it is contemplated that the parallel beams (or spots) may be either a one-dimensional (1D) beam array or a two-dimensional (2D) beam matrix without departing from the spirit and scope of the present disclosure.

It is also contemplated that the parallel beams provided in this manner can be stationary or scanning. Scanning can be implemented using AOD scanners, polygons or resonant scanners and scanning speed can have a wide range of speeds from spots/month to spots/nanosecond. While the particular scanner and scanning speed utilized may vary, it is noted that the scanner in accordance with the present disclosure needs to be positioned before the frequency converter 106, as depicted in FIG. 1.

Positioning the scanner before the frequency converter 106 in accordance with the present disclosure is beneficial because in a typical scanning system, such as an AOD scanner, the efficiency of the DUV scanner is in the order of 50%. That means half of the light is lost. Since higher power visible sources are available at reasonable cost, a loss of light in the visible source before frequency conversion is more acceptable. In addition, not having the 50% loss in the scanner means that for the same effective scanning power, less input light is needed, and the front end optics see less DUV fluence and have longer life and/or less potential for damage.

Furthermore, the life of the frequency converter 106 is enhanced by scanning one or multiple spots across the crystal, or by splitting a stationary spot into multiple spots that will hit the frequency converter 106. Such a configuration reduces the time-averaged fluence at each point in the crystal and uses more of the available area in the crystal, which is more advantageous in comparison to a fixed spot frequency converting laser.

It is contemplated that the frequency converter 106 may include one or more frequency converting crystals configured for providing harmonic generation, frequency mixing, and/or other nonlinear effects. For instance, the frequency converter 106 may include a single large crystal or multiple smaller crystals.

Figure 2:
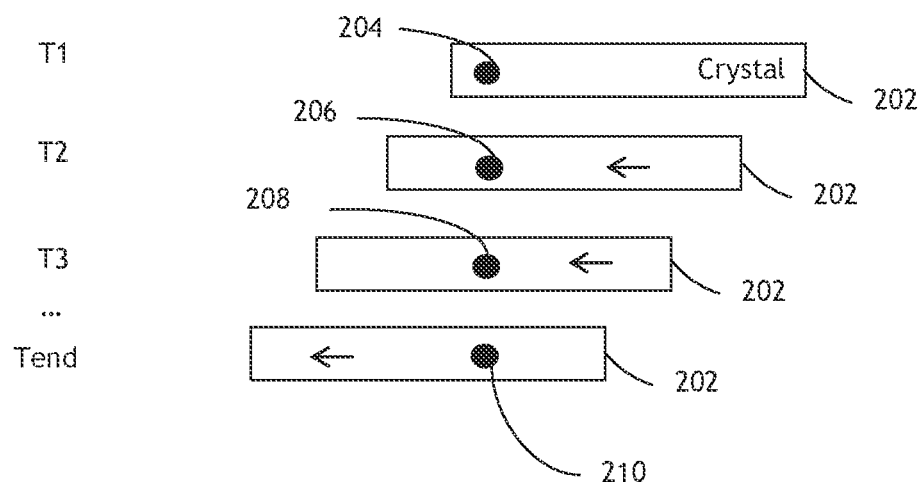
FIG. 2 is a series of cross-sectional views depicting shifting of a frequency conversion crystal over time.

It is also contemplated that one or more crystals in the frequency converter 106 may be optionally configured to shift to further extend its lifetime. FIG. 2 is a series of cross-sectional views depicting the shifting of a crystal 202 over time. More specifically, at time $T_1$, the crystal 202 may receive the incoming beam at the spot indicated as spot 204. This may continue for a period of time, and subsequently at time $T_2$, the crystal 202 may be shifted by a predetermined amount and start to receive the incoming beam at a new spot 206. Similarly, after a period of time, the crystal 202 may be shifted again by the predetermined amount and start to receive the incoming beam at spot 208 starting at time $T_3$. This shifting operation may continue till $T_{end}$, when shifting may repeat again from the position shown in $T_1$, or when the crystal 202 may have reached the full lifetime and need to be replaced.

Figure 3:
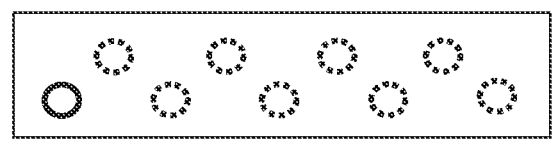
FIG. 3 is a cross-sectional view depicting shifting of a frequency conversion crystal in both axes.

In addition to shifting the crystal in one particular axis as depicted in FIG. 2, the crystal may also be displaced in both axes to have high density scanner swaths within the larger serpentine swaths of the crystal, as illustrated in FIG. 3. It is understood, however, that whether to shift the crystals in the frequency converter 106, and how the crystals are shifted, are optional design choices, which may or may not need to be implemented without departing from the spirit and scope of the present disclosure.

Integrating the beam scanning and line generation optics into the laser source in accordance with the present disclosure is beneficial for providing illumination for wafer inspection systems. In a particular example of a 266 nm laser, where the DUV light is generated by sending a green 532 nm source through a fourth harmonic generation (FHG) crystal (i.e., the frequency converter), the beam scanner would be placed, in accordance with the present disclosure, between the laser source and the FHG crystal and the related optics. The green beam would be scanning over the FHG crystal, spreading out the power instead of focusing it on a fixed spot as in a conventional inspection system design. Placing the beam scanner between the laser source and the FHG crystal in accordance with the present disclosure results in a proportionally higher crystal life.

More specifically, suppose for illustrative purposes that an AOD scanner is positioned between the laser source and the FHG crystal, the number of spots is in the order of 200 for a typical AOD scanner, and the FHG crystal has a width of 200 adjacent spots (roughly equivalent to 50 individual spots in a fixed spot laser, considering the margin left around each spot). If each spot has a lifetime of 500 hours in a conventional setup, the crystal as a whole would have a lifetime of 200×500 h=100,000 hours (assuming a linear relationship) in accordance with the setup depicted in FIG. 1. This is compared to 50×500 h in a conventional fixed spot system, where the conversion crystal is shifted in discrete steps from one location to another leaving safety margin between spots. It is contemplated that the laser may be designed to last that full lifetime, or the spots may be focused tighter to improve efficiency and gain more output power at a lower lifetime. It is also contemplated that non-uniformity of the conversion efficiency of the crystal may be calibrated or corrected for by the AOD scanning intensity throughout a sweep, as long as the crystal does not have a dead spots in the scan area.

While the examples above referenced a single-line inspection system, it is contemplated that integrating the beam scanning and line generation optics into the laser source in accordance with the present disclosure is also applicable in a multi-line or a multi-spot inspection system in a similar manner. For instance, the laser source 102 depicted in FIG. 1 is not limited to a single-line laser source, and a multi-line laser source may be utilized without departing from the spirit and scope of the present disclosure. It is understood that the value provided by using a multi-line laser source is a design choice based on various illumination requirements.

Figure 4:
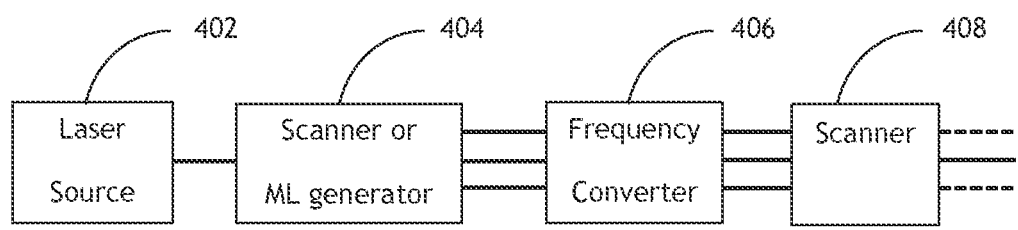
FIG. 4 is a block diagram depicting a generalized illumination system in accordance with one embodiment of the present disclosure.

It is further contemplated that the illumination system described above may be used in more general use cases outside of laser scanning systems. For instance, as depicted in FIG. 4, a beam provided by the laser source 402 (e.g., 532 nm laser source) is scanned using the scanner 404 over the frequency converting crystal 406, which converts the beam to 266 nm. An additional scanner 408 (e.g., an AOD scanner) may then be utilized to de-scan (in other words, re-combine) the output from the frequency converting crystal 406 to provide a fixed beam output. Such a configuration allows the laser to be used in more general use cases outside of laser scanning systems, enhancing frequency converting laser sources in general (in particular with UV and DUV output) and taking advantage of the lower crystal damage for the reasons previously described. It is contemplated, however, that the output of the additional scanner 408 may also be configured as multiple lines for multiline inspection/illumination.

It is still further contemplated that the systems depicted in the examples above are merely exemplary, and additional components may be utilized in such systems. For instance, in certain embodiments, relay lenses may be placed before or after the frequency converter, and some optics may be utilized to increase field of view for intra-cavity frequency conversion without departing from the spirit and scope of the present disclosure. Furthermore, the specific reference to the 532 nm wavelength described above is merely exemplary. Various other types of laser sources may be utilized, and harmonic generation can be extended to wavelength shorter than 266 nm without departing from the spirit and scope of the present disclosure.

It is noted that the illumination systems described in accordance with the present disclosure is overall more cost effective, since the scanner losses are moved to the higher wavelength portion of the laser. There are no more scanning losses of the DUV output power. For example, 1 W DUV output power in a conventional setup can be replaced by less than 500 mW DUV output power in the setup in accordance with the present disclosure. In addition, the setup in accordance with the present disclosure uses more area/volume of the frequency converting crystal and extends the lifetime significantly. Since changing crystal spot is only optional, crystal shifting mechanisms may be eliminated to further reduce the overall system complexity and cost. Furthermore, the setup in accordance with the present disclosure has the potential to improve the overall system reliability and life, since the number of optical components in the DUV path is significantly reduced. In case of an AOD scanner, most of the front end high fluence optics would not be needed anymore, resulting in roughly twice reduction of optical surfaces.

Figure 5:
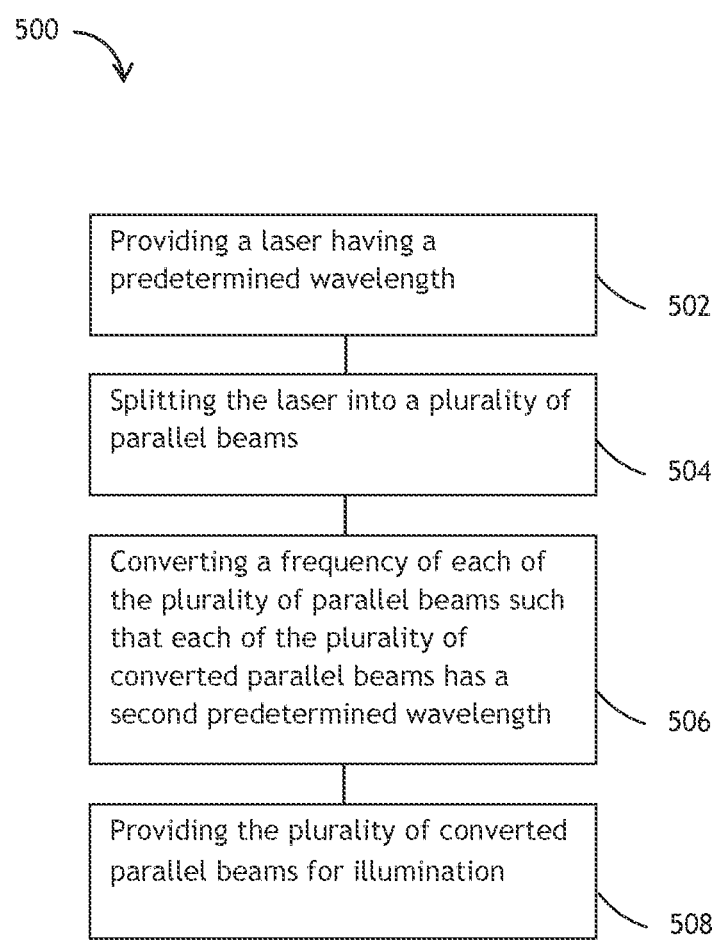
FIG. 5 is a flow diagram illustrating a method for providing multiple/parallel beams using parallel frequency conversion to avoid crystal damage and achieve high power output in accordance with the one embodiment of the present disclosure.

FIG. 5 is a flow diagram illustrating a method 500 for providing multiple/parallel beams using parallel frequency conversion to avoid crystal damage and achieve high power output in accordance with the one embodiment of the present disclosure. Step 502 may provide a laser having a predetermined wavelength. Step 504 may then split the laser into a plurality of parallel beams prior to frequency conversion. Subsequently, the parallel beams are received at a frequency converter, which converts the frequency of each parallel beam in step 506 such that the converted beam has a second predetermined wavelength different from the original wavelength. Step 508 may then provide the converted parallel beams for illumination.

It is contemplated that step 504 is not limited to splitting the laser into a plurality of parallel beams. For instance, step 504 may be configured to scan the laser received in order to deliver a single scanning line prior to the frequency conversion. Alternatively/additionally, step 504 may be configured to provide multiple fixed spots or multiple scanning lines prior to the frequency conversion step 506. By scanning one or multiple spots across the frequency converter, or by splitting a stationary spot into multiple spots that will hit the frequency converter, the life of the frequency converter is enhanced.

The methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is understood that the specific values for power, wavelength, frequency and the like referenced in the description above are merely exemplary. It is contemplated that various other values or range of values may be applicable without departing from the spirit and scope of the present disclosure.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. An illumination apparatus, comprising:
   a laser source, the laser source configured for providing a laser having a predetermined DUV wavelength and a power up to 500 mW;
   a beam scanner, the beam scanner configured for directly receiving the laser from the laser source and scanning the laser from the laser source utilizing a polygon scanner or a resonant scanner to provide a plurality of parallel beams; and
   a frequency converter, the frequency converter configured for receiving the plurality of parallel beams, converting the frequency of each of the plurality of parallel beams such that each of the plurality of converted parallel beams has a second predetermined wavelength, and providing the plurality of converted parallel beams as output,
   wherein the plurality of parallel beams are distributed across a plurality of spots on the frequency converter during operations of the illumination apparatus to reduce time-averaged fluences at the plurality of spots on the frequency converter.

2. The illumination apparatus of claim 1, wherein the frequency converter includes at least one frequency converting crystal.

3. The illumination apparatus of claim 2, wherein the at least one frequency converting crystal is a harmonic generation crystal.

4. The illumination apparatus of claim 1, wherein the frequency converter is a single frequency converting crystal.

5. The illumination apparatus of claim 1, wherein the frequency converter is configured for receiving the plurality of parallel beams directly from the beam scanner.

6. The illumination apparatus of claim 1, wherein the second predetermined wavelength is within a range of Deep Ultraviolet (DUV).

7. The illumination apparatus of claim 1, further comprising:
a shifting mechanism, the shifting mechanism configured for shifting position of the frequency converter relative to the plurality of parallel beams over time.

8. The illumination apparatus of claim 1, further comprising:
a second scanner, the second scanner positioned at the output of the frequency converter, the second scanner configured for providing de-scanning after frequency conversion of the plurality of parallel beams to combine the output of the frequency converter.

9. An illumination apparatus, comprising:
a laser source, the laser source configured for providing a laser having a predetermined DUV wavelength and a power up to 500 mW;
a frequency converter; and
a beam scanner, the beam scanner positioned in the optical path between the laser source and the frequency converter, the beam scanner configured for scanning the laser from the laser source utilizing a polygon scanner or a resonant scanner and providing a plurality of parallel beams prior to frequency conversion.

10. The illumination apparatus of claim 9, wherein the scanner is a single-line scanner.

11. The illumination apparatus of claim 9, wherein the scanner is a multi-line scanner.

12. The illumination apparatus of claim 9, wherein the frequency converter includes a single frequency converting crystal.

13. The illumination apparatus of claim 12, further comprising:
a shifting mechanism, the shifting mechanism configured for shifting position of the frequency converting crystal relative to optical output of the scanner over time.

14. The illumination apparatus of claim 9, wherein the illumination apparatus is configured for providing illumination for a wafer inspection system.

15. The illumination apparatus of claim 14, wherein the frequency converter is configured for providing at least one frequency converted beam having a wavelength within a range of Deep Ultraviolet (DUV).

16. The illumination apparatus of claim 1, wherein the plurality of parallel beams is formed into at least one of: a one-dimensional array of parallel beams or a two-dimensional matrix of parallel beams.

17. The illumination apparatus of claim 9, further comprising:
a second scanner, the second scanner positioned at the output of the frequency converter, the second scanner configured for providing de-scanning after frequency conversion to combine the output of the frequency converter.

18. A method for providing illumination, comprising:
providing a laser having a predetermined DUV wavelength and a power up to 500 mW;
scanning a beam from the laser utilizing a polygon scanner or a resonant scanner into at least one of a one-dimensional array of parallel beams or a two-dimensional matrix of parallel beams so as to distribute two or more portions of the laser beam across a plurality of spots on a frequency converter prior to performing frequency conversion with the frequency converter to reduce time-averaged fluences at the plurality of spots on the frequency converter;
performing frequency conversion, with the frequency converter, directly on the laser beam following scanning to form a frequency converted output beam; and
providing the frequency converted output beam for illumination.

19. The method of claim 18, further comprising:
shifting position of the frequency converter relative to at least one of the one-dimensional array of parallel beams or the two-dimensional matrix of parallel beams.

20. The illumination apparatus of claim 9, wherein the plurality of parallel beams is formed into at least one of: a one-dimensional array of parallel beams or a two-dimensional matrix of parallel beams.

* * * * *